United States Patent
Tokumoto et al.

(10) Patent No.: US 8,653,875 B2
(45) Date of Patent: Feb. 18, 2014

(54) SEMICONDUCTOR DEVICE, A METHOD OF IMPROVING A DISTORTION OF AN OUTPUT WAVEFORM, AND AN ELECTRONIC APPARATUS

(75) Inventors: Morihiko Tokumoto, Kyoto-fu (JP); Masayu Fujiwara, Kyoto-fu (JP); Satoshi Mikami, Kyoto-fu (JP)

(73) Assignee: Rohm Co., Ltd., Kyoto-Fu (JP)

( * ) Notice: Subject to any disclaimer, the term of this patent is extended or adjusted under 35 U.S.C. 154(b) by 15 days.

(21) Appl. No.: 13/432,097

(22) Filed: Mar. 28, 2012

(65) Prior Publication Data

US 2012/0249205 A1   Oct. 4, 2012

(30) Foreign Application Priority Data

Mar. 31, 2011   (JP) ................................ 2011-079225
Feb. 28, 2012   (JP) ................................ 2012-041347

(51) Int. Cl.
*H03H 11/26*   (2006.01)
(52) U.S. Cl.
USPC ............ 327/269; 327/231; 327/295; 327/297
(58) Field of Classification Search
USPC ......... 327/231–235, 263, 269, 271–272, 291, 327/293, 295–297, 565
See application file for complete search history.

(56) References Cited

U.S. PATENT DOCUMENTS

| | | | | |
|---|---|---|---|---|
| 5,764,092 A * | 6/1998 | Wada et al. | ................... | 327/271 |
| 5,852,640 A * | 12/1998 | Kliza et al. | ................... | 375/356 |
| 6,131,168 A * | 10/2000 | Krzyzkowski | ................ | 713/503 |
| 6,535,038 B2 * | 3/2003 | Hofstra | ......................... | 327/158 |
| 7,100,066 B2 * | 8/2006 | Jeong | ........................... | 713/500 |

FOREIGN PATENT DOCUMENTS

| | | |
|---|---|---|
| JP | 06-028056 | 2/1994 |
| JP | 2002-176343 | 6/2002 |

* cited by examiner

*Primary Examiner* — An Luu
(74) *Attorney, Agent, or Firm* — Fish & Richardson P.C.

(57) ABSTRACT

Provided is a semiconductor device which inputs an input clock signal of predetermined frequency and outputs a plurality of clock signals of the same frequency, the semiconductor device including: an input unit configured to input the input clock signal of the predetermined frequency; and a delay unit configured to generate a plurality of clock signals of the same frequency by providing predetermined delay time period to the input clock signal to be delayed in order to reduce load applied to a power supply in common with the plurality of the clock signals. According to the semiconductor device, output waveform distortion of the clock signals can be improved even with simple structure.

11 Claims, 22 Drawing Sheets

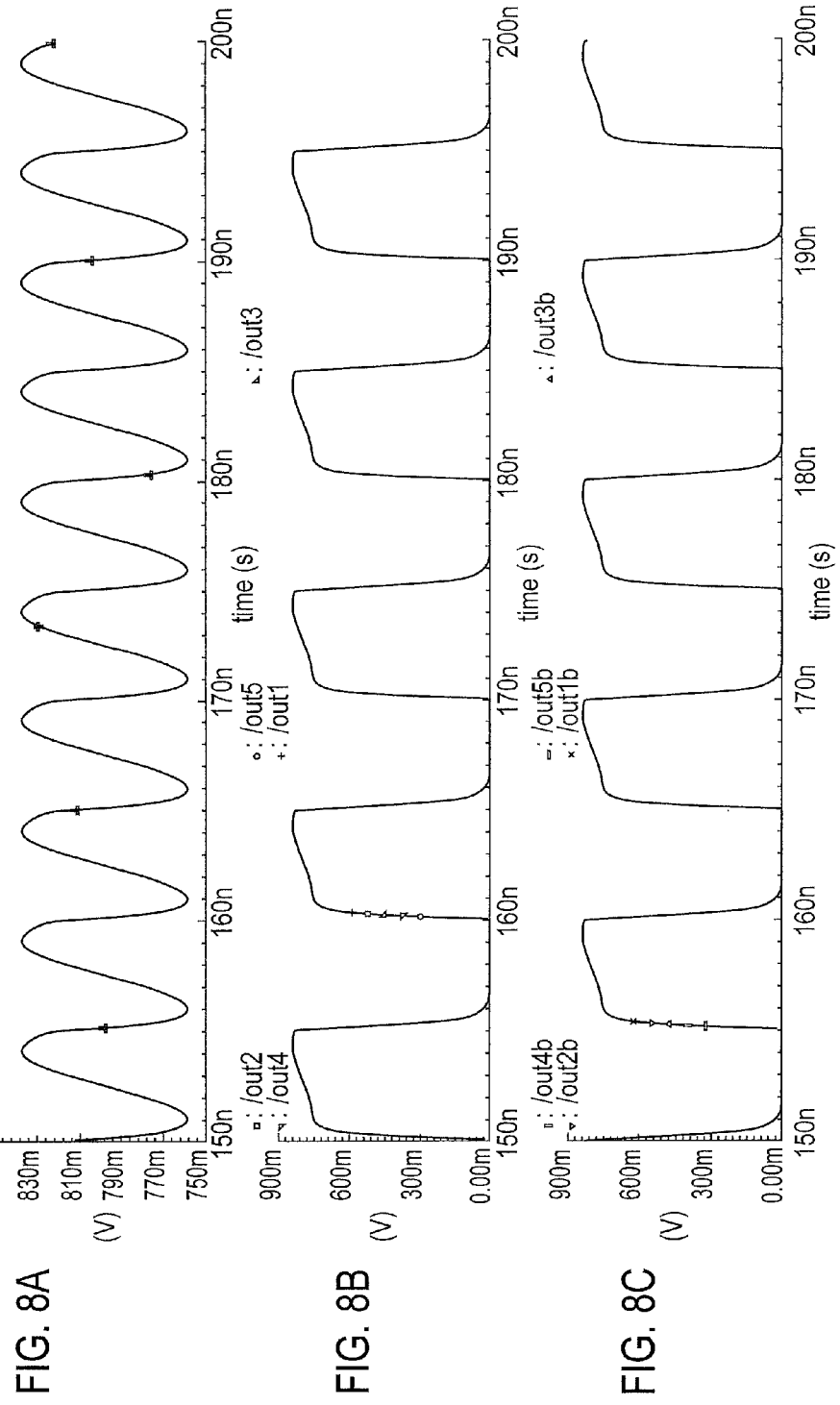

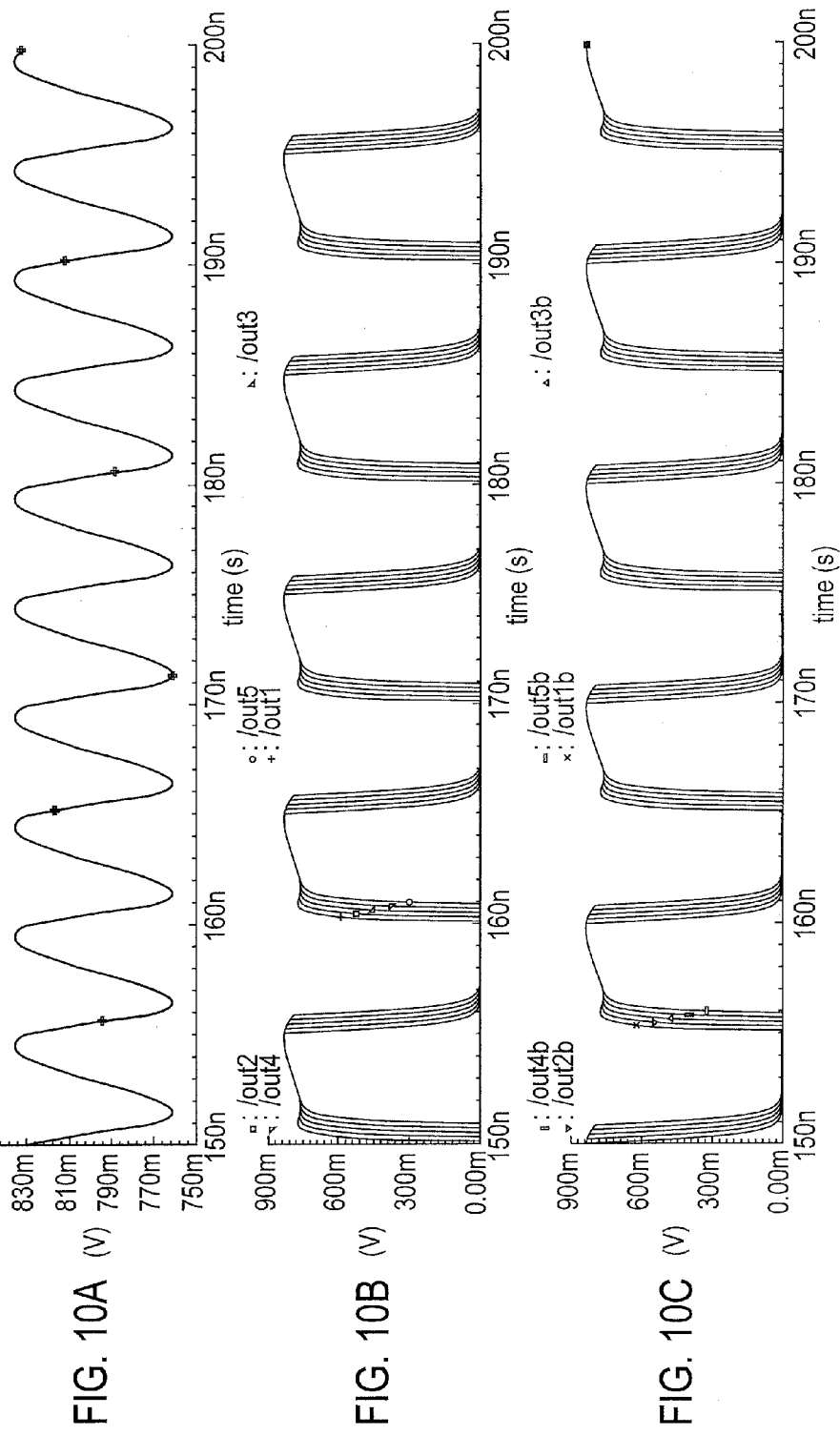

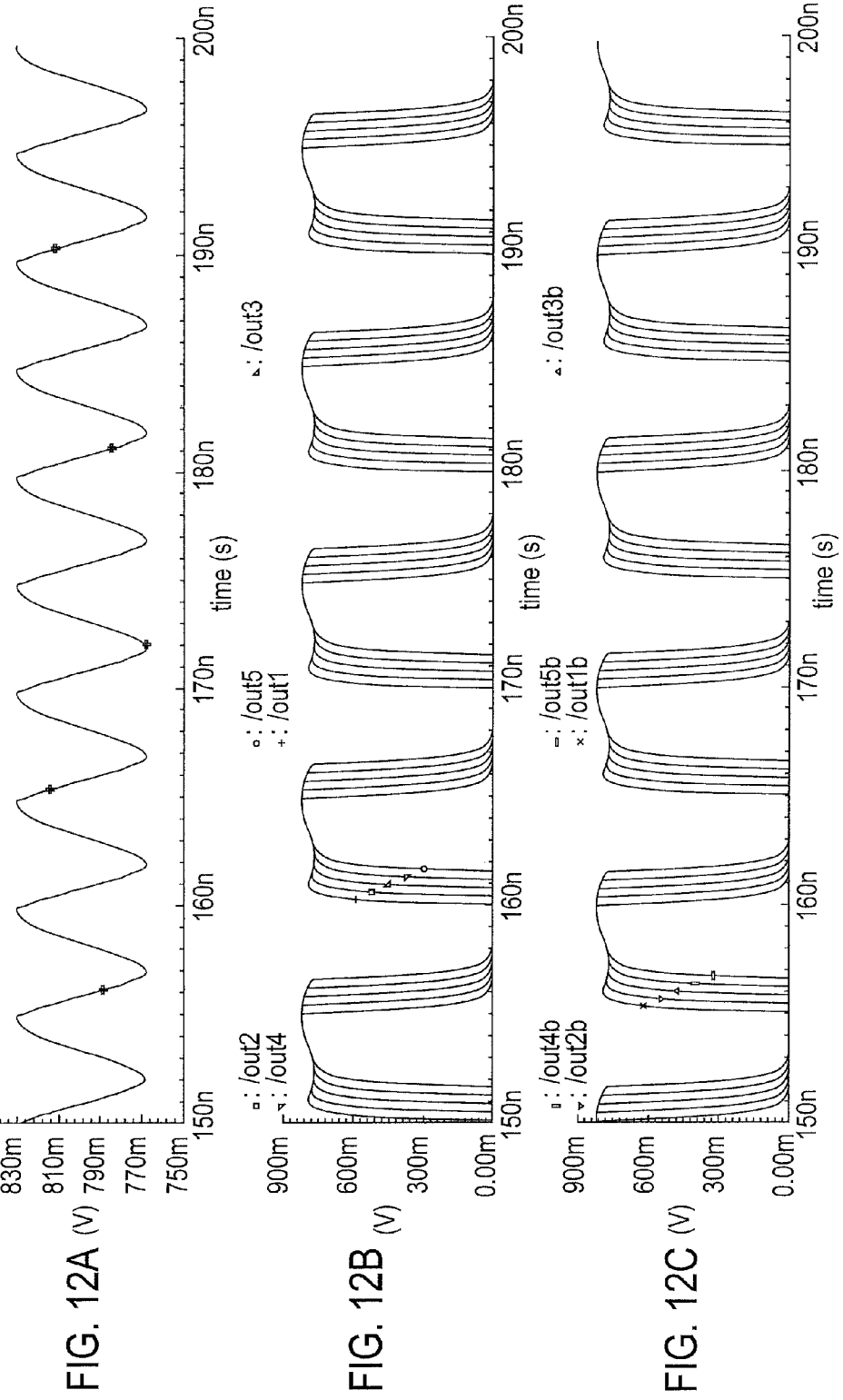

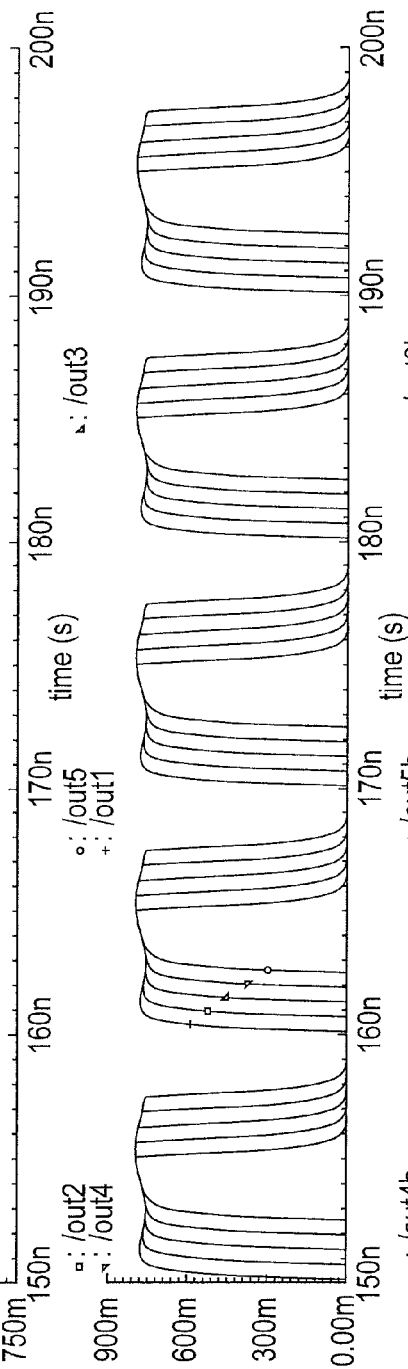
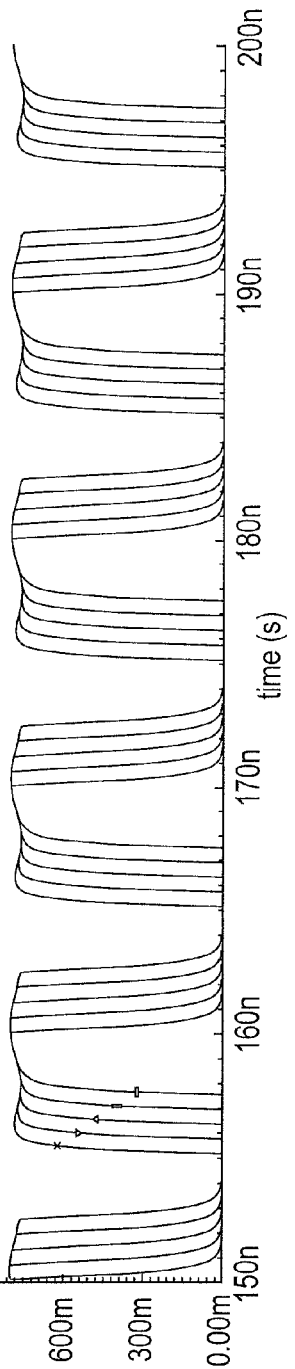
FIG. 14A
FIG. 14B
FIG. 14C

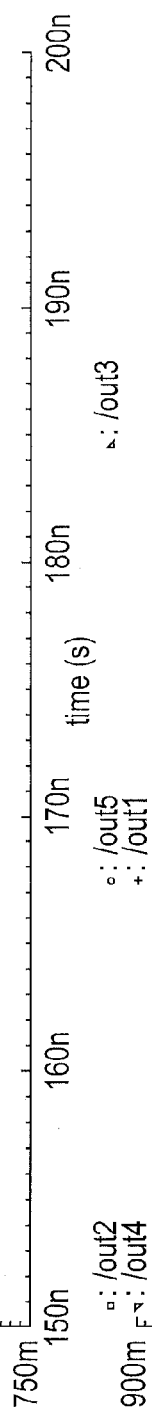
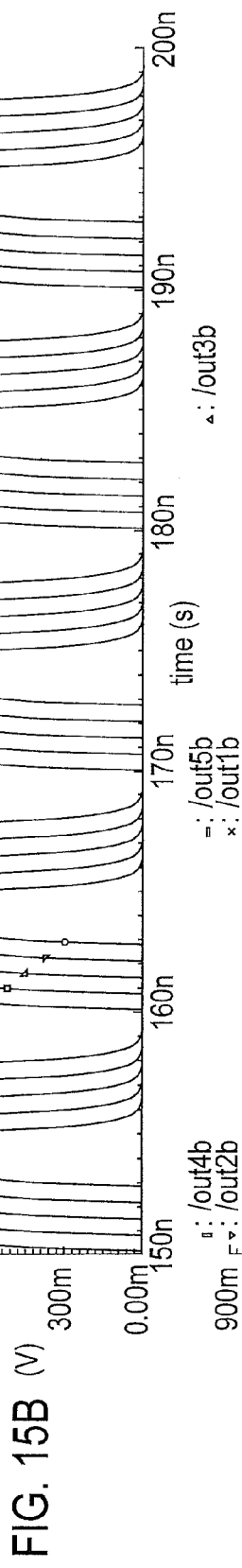
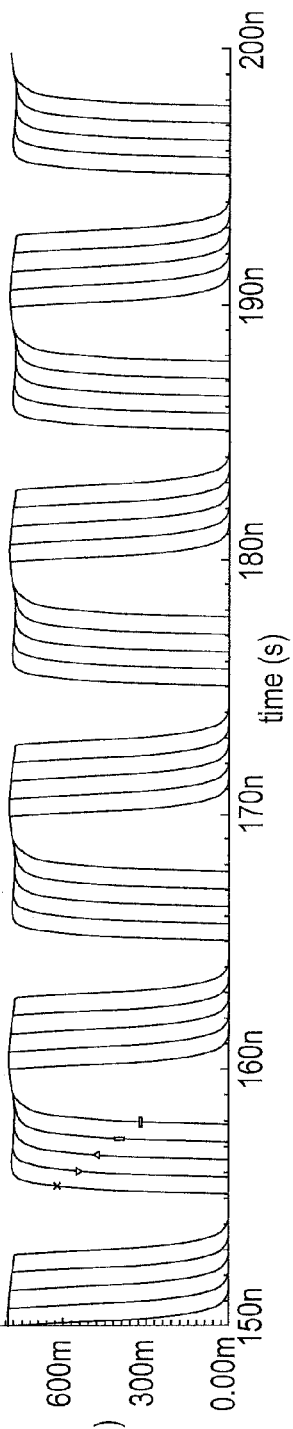
FIG. 15A
FIG. 15B
FIG. 15C

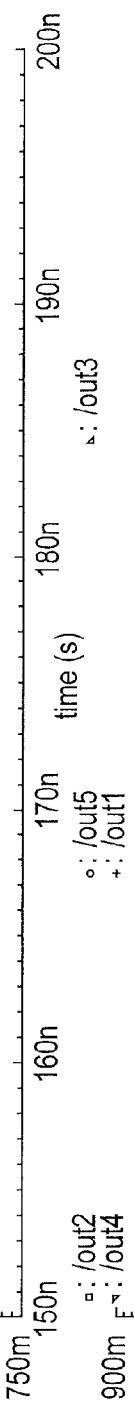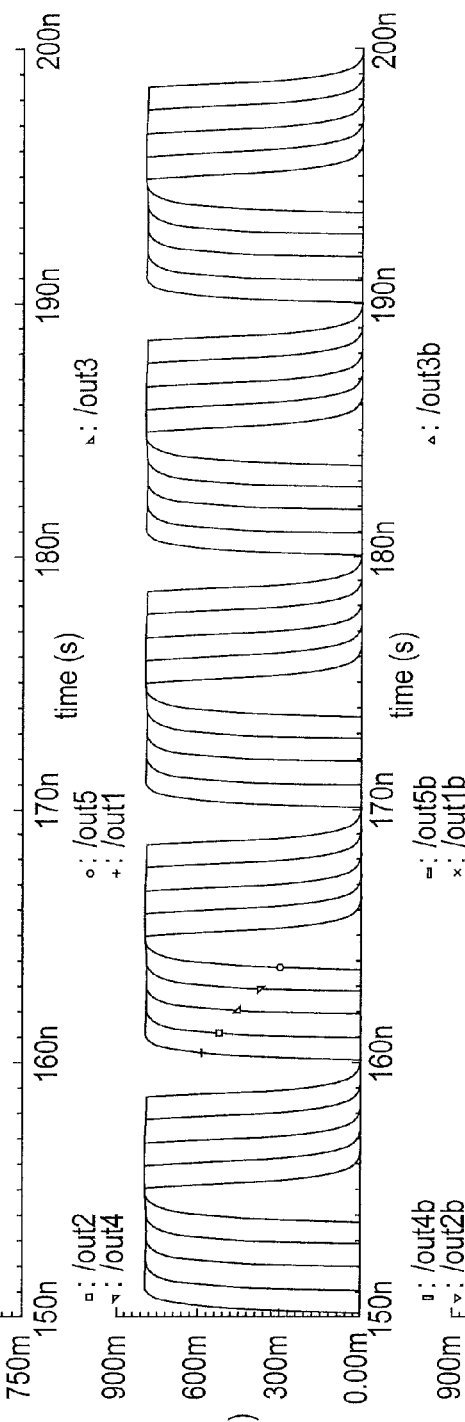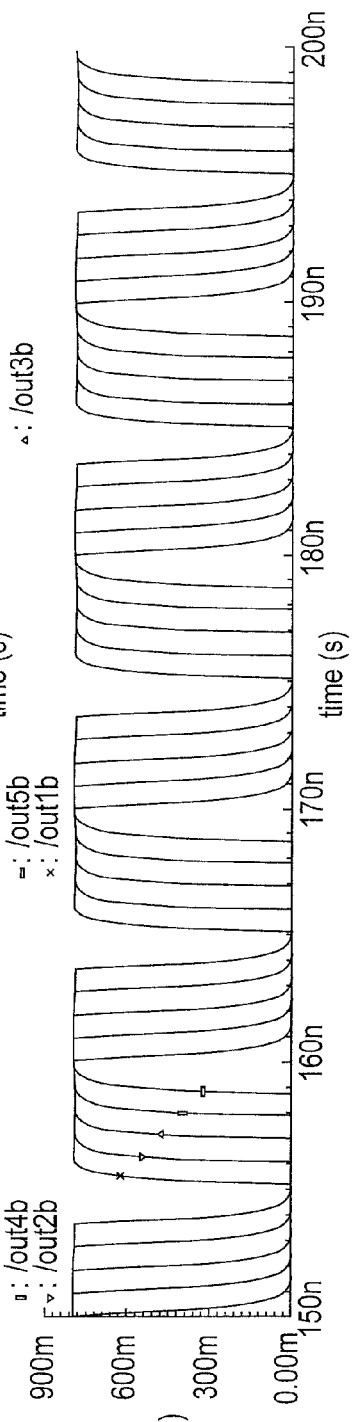
FIG. 17A
FIG. 17B
FIG. 17C

SEMICONDUCTOR DEVICE, A METHOD OF IMPROVING A DISTORTION OF AN OUTPUT WAVEFORM, AND AN ELECTRONIC APPARATUS

CROSS REFERENCE TO RELATED APPLICATIONS

This application is based upon and claims the benefit of priority from prior Japanese Patent Application Nos. P2011-79225 filed on Mar. 31, 2011, and P2012-041347 filed on Feb. 28, 2012, the entire contents of which are incorporated herein by reference.

TECHNICAL FIELD

The present invention relates to a semiconductor device, an electronic apparatus, and a method of improving an output waveform distortion. The semiconductor device inputs an input clock signal of a predetermined frequency and output a plurality of clock signals of the same frequency.

BACKGROUND ART

Generally, since a plurality of clock signals are required for an electronic apparatus, an apparatus which outputs a plurality of clock signals of the same frequency is known (Refer to Patent Literatures 1 and 2). However, if a plurality of clock signals of precisely same frequency is output simultaneously, load applied to a power supply will be increased, thereby becoming a factor in which an output waveform of the clock signals is distorted. Thus, it has been known about a method of including a power supply for each output of clock signal as shown in FIG. 1, a method of building a regulator for each output of clock signal as indicated in FIG. 2, etc. According to the above-mentioned methods, since an individual power supply is included in each output of clock signal, an output waveform distortion of the clock signals can be improved.

CITATION LIST

Patent Literature 1: Japanese Patent Application Laying-Open Publication No. H06-28056
Patent Literature 2: Japanese Patent Application Laying-Open Publication No. 2002-176343

SUMMARY OF THE INVENTION

Technical Problem

However, although output waveform distortion of clock signals can be improved, it was hard to adopt actually the above-mentioned conventional technologies. For example, the method of including the individual power supply for each output of clock signals is not adoptable if there is no remainder of the number of pins of the power supply. On the other hand, since a circuit area becomes wide according to the method of building the regulator for each output of clock signals, there is a problem that the cost will be increased.

The present invention is achieved in order to solve the above-mentioned problems. The purpose of the present invention is to provide a semiconductor device, an electronic apparatus, and a method of improving an output waveform distortion each which can improve output waveform distortion of clock signals even with simple structure.

Solution to Problem

One aspect of the present invention for achieving the above-mentioned purpose is to provide a semiconductor device comprising: an input unit configured to input an input clock signal of predetermined frequency; and a delay unit configured to generate a plurality of clock signals of the same frequency by providing predetermined delay time period to the input clock signal to be delayed in order to reduce load applied to a power supply in common with the plurality of the clock signals.

Another aspect of the present invention is to provide a method of improving a distortion of an output waveform, the method comprising: inputting an input clock signal of predetermined frequency; and generating a plurality of clock signals of the same frequency by providing predetermined delay time period to the input clock signal to be delayed in order to reduce load applied to a power supply in common with the plurality of the clock signals.

Still another aspect of the present invention is to provide an electronic apparatus comprising the aforementioned semiconductor device.

Advantageous Effects of Invention

According to the present invention, it can provide a semiconductor device, an electronic apparatus, and a method of improving an output waveform distortion each which can improve output waveform distortion of clock signals even with simple structure.

BRIEF DESCRIPTION OF DRAWINGS

FIG. 8A is a diagram showing the case where the delay time period is 0 psec according to the embodiment of the present invention, and a diagram showing power supply potential.

FIG. 8B is a diagram showing the case where the delay time period is 0 psec according to the embodiment of the present invention, and a diagram showing five normal clock signals.

FIG. 8C is a diagram showing the case where the delay time period is 0 psec according to the embodiment of the present invention, and a diagram showing five inverted clock signals.

FIG. 10A is a diagram showing the case where the delay time period is 200 psec according to the embodiment of the present invention, and a diagram showing power supply potential.

FIG. 10B is a diagram showing the case where the delay time period is 200 psec according to the embodiment of the present invention, and a diagram showing five normal clock signals.

FIG. 10C is a diagram showing the case where the delay time period is 200 psec according to the embodiment of the present invention, and a diagram showing five inverted clock signals.

FIG. 12A is a diagram showing the case where the delay time period is 400 psec according to the embodiment of the present invention, and a diagram showing power supply potential.

FIG. 12B is a diagram showing the case where the delay time period is 400 psec according to the embodiment of the present invention, and a diagram showing five normal clock signals.

FIG. 12C is a diagram showing the case where the delay time period is 400 psec according to the embodiment of the present invention, and a diagram showing five inverted clock signals.

FIG. 14A is a diagram showing the case where the delay time period is 600 psec according to the embodiment of the present invention, and a diagram showing power supply potential.

FIG. 14B is a diagram showing the case where the delay time period is 600 psec according to the embodiment of the present invention, and a diagram showing five normal clock signals.

FIG. 14C is a diagram showing the case where the delay time period is 600 psec according to the embodiment of the present invention, and a diagram showing five inverted clock signals.

FIG. 15A is a diagram showing the case where the delay time period is 700 psec according to the embodiment of the present invention, and a diagram showing power supply potential.

FIG. 15B is a diagram showing the case where the delay time period is 700 psec according to the embodiment of the present invention, and a diagram showing five normal clock signals.

FIG. 15C is a diagram showing the case where the delay time period is 700 psec according to the embodiment of the present invention, and a diagram showing five inverted clock signals.

FIG. 17A is a diagram showing the case where the delay time period is 900 psec according to the embodiment of the present invention, and a diagram showing power supply potential.

FIG. 17B is a diagram showing the case where the delay time period is 900 psec according to the embodiment of the present invention, and a diagram showing five normal clock signals.

FIG. 17C is a diagram showing the case where the delay time period is 900 psec according to the embodiment of the present invention, and a diagram showing five inverted clock signals.

DESCRIPTION OF EMBODIMENTS

Figure 1:
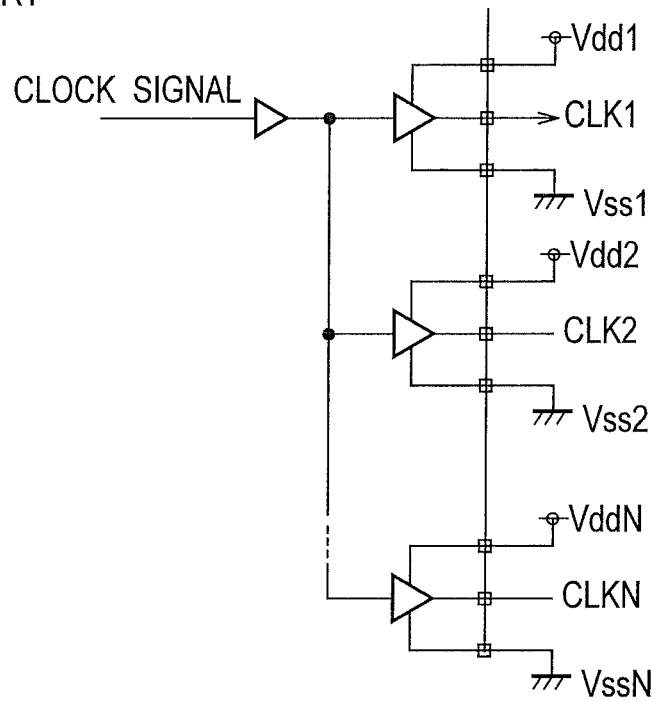
FIG. 1 is an explanatory diagram of a conventional method of improving an output waveform distortion.
Figure 2:
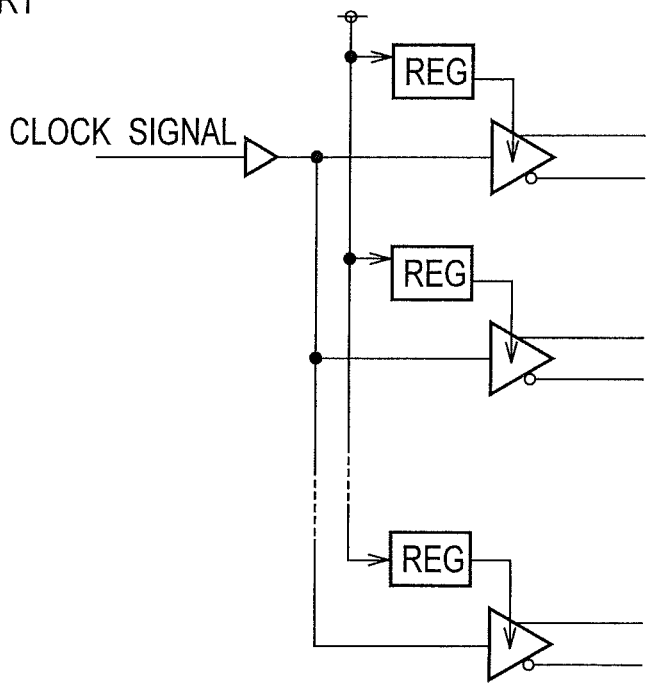
FIG. 2 is an explanatory diagram of a conventional method of improving an output waveform distortion.

Next, certain embodiments of the invention will be described with reference to drawings. In the description of the following drawings, the identical or similar reference numeral is attached to the identical or similar part. However, it should be known about that the drawings are schematic and the relation between thickness and the plane size and the ratio of the thickness of each layer differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea of the present invention; and the embodiments of the present invention does not specify the material, shape, structure, placement, etc. of component parts as the following. Various changes can be added to the technical idea of the present invention in scope of claims.

Hereinafter, an embodiment of the present invention will be described in detail with reference to drawings.

(Configuration Example of Semiconductor Device)

Figure 3:
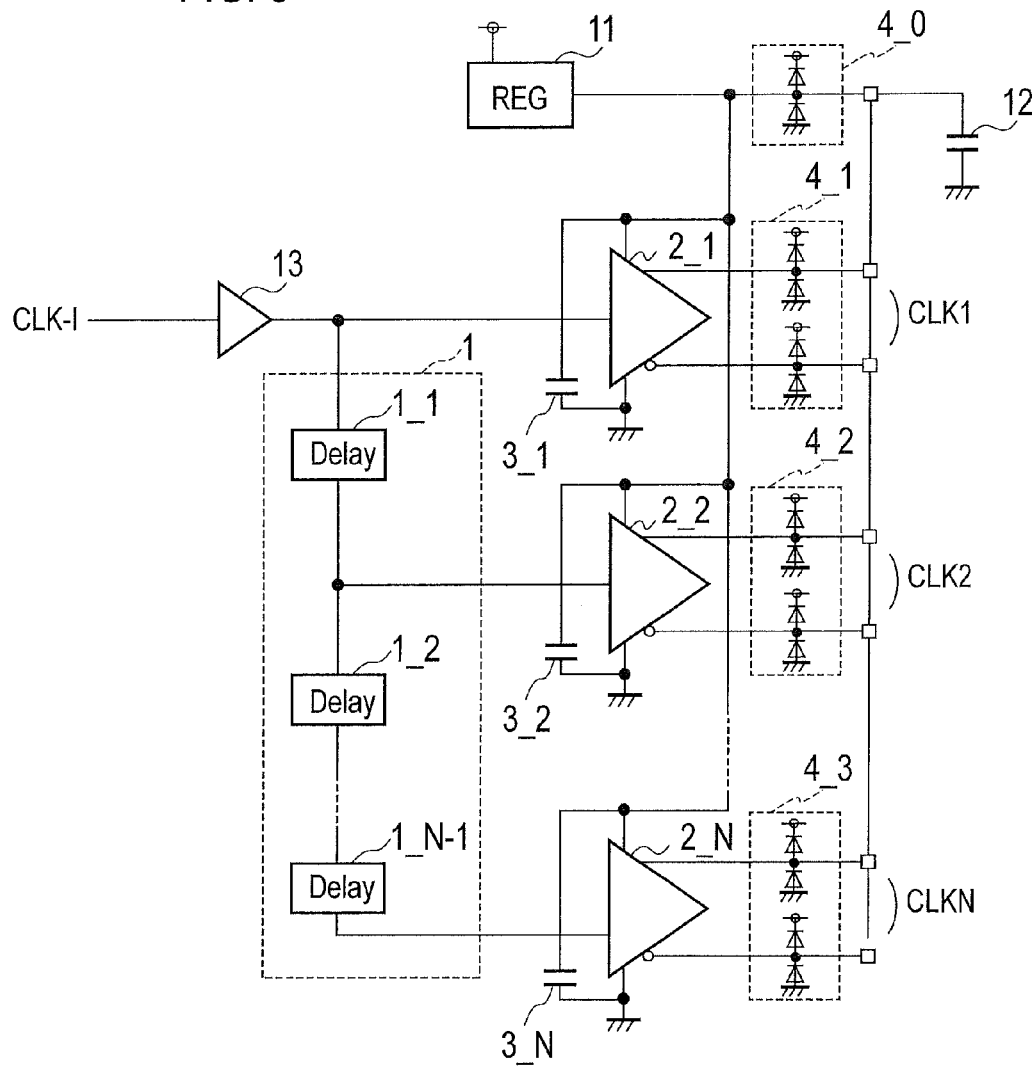
FIG. 3 is a configuration diagram of a semiconductor device according to an embodiment of the present invention.

FIG. 3 is a configuration diagram of a semiconductor device in an embodiment of the present invention. As shown in FIG. 3, the semiconductor device is an apparatus which inputs an input clock signal CLK-I of predetermined frequency, and outputs N clock signals CLK1-CLKN of the same frequency, and adopts the following structure.

Firstly, a delay unit 1 provides predetermined delay time period in contrast to a plurality of clock signals in order to improve output waveform distortion of the clock signals. More specifically, It is composed of N-1 delay gates $1\_1, 1\_2, \ldots, 1\_N\text{-}1$ whose delay time period is the same, connected in a shape of cascade.

The input clock signal CLK-I input from an input unit is input into the delay gate $1\_1$ via a buffer 13. An output from each delay gate $1\_1, 1\_2, \ldots$ is input into each delay gate $1\_2, 1\_3, \ldots$ in a subsequent stage, as clock signals CLK2, CLK3.

The input clock signal CLK-I and the clock signals CLK2-CLKN are input into each operational amplifier $2\_1, 2\_2, \ldots, 2\_N$. Accordingly, each operational amplifier $2\_1, 2\_2, \ldots, 2\_N$ outputs two differential clock pairs (i.e., a normal clock signal and an inverted clock signal) in which polarity is reversed from each output terminal.

IO sections $4\_1, 4\_2, \ldots, 4\_N$ for preventing an electrostatic discharge damage are disposed respectively in a subsequent stage of the operational amplifiers $2\_1, 2\_2, \ldots, 2\_N$. More specifically, the IO sections $4\_1, 4\_2, \ldots, 4\_N$ are a diode between a clock line and a power supply, and a diode between a clock line and ground line (GND line). An IO section $4\_0$ which is a protective element is disposed also at an output terminal of a regulator 11. In the following explanation, the operational amplifiers $2\_1, 2\_2, \ldots, 2\_N$ and the IO sections $4\_1, 4\_2, \ldots, 4\_N$ are collectively named "output IO" in some cases.

(Disposition Example of Bypass Capacitor)

Figure 4:
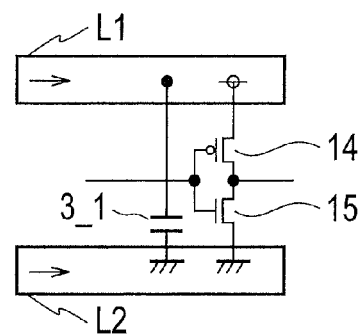
FIG. 4 is a diagram showing a disposition example of a bypass capacitor according to the embodiment of the present invention.

According to the embodiment, as shown in FIG. 3, bypass capacitors $3\_1, 3\_2, \ldots, 3\_N$ are closely disposed for each output IO (the details are described later). FIG. 4 shows a detailed disposition example of the bypass capacitor $3\_1$. In FIG. 4, reference numeral 14 denotes P-channel MOS FET, and reference numeral 15 denotes N-channel MOS FET. A gate of the FET 14 is connected to a gate of the FET 15, and a drain of the FET 14 is connected to a drain of the FET 15. A source of the FET 14 is connected to a power supply line (Vdd line) L1, and a source of the FET 15 is connected to a ground line (Vss line) L2. An inverter is composed of the FET 14 and the FET 15. A first edge of the bypass capacitor $3\_1$ is connected to the power supply line L1, and a second edge of the bypass capacitor $3\_1$ is connected to the ground line L2. Capacity of the bypass capacitor $3\_1$ can be determined arbitrarily. Other bypass capacitors $3\_2, \ldots, 3\_N$ are the same as that of the bypass capacitor $3\_1$.

Specifically, the regulator 11 shown in FIG. 3 is low drop out (LDO). A bypass capacitor 12 is disposed outside in order to keep voltage of the LDO constant to some extent. A parasitic coil component may exist in a wire connected to the output terminal. Since such as a coil component may act in a way to obstruct a fast component, the bypass capacitor is preferable to be disposed at a position in a minimum value of the coil component. Thus, in the embodiment, the bypass capacitor is disposed between the power supply and the output IO, in a position near the output IO, as shown in FIG. 4.

(Delaying Operation)

Hereinafter, an operation example at the time where such a semiconductor device delays a clock signal will be explained in detail.

Firstly, the input clock signal CLK-I is input into the delay gate 1_1 while being output from the output terminal as the clock signal CLK1 of two differential clock pairs, without being delayed. The input clock signal CLK-I input into the delay gate 1_1 is delayed with a predetermined time period (e.g., 1 psec) as a clock signal CLK2. The clock signal CLK2 is delayed with the predetermined time period as compared with the clock signal CLK1.

Subsequently, the clock signal CLK2 produced in the delay gate 1_1 is input into the delay gate 1_2 while being output from the output terminal of the delay gate 1_1 as the clock signal CLK2 of two differential clock pairs. The clock signal CLK2 input into the delay gate 1_2 is further delayed with the predetermined time period as a clock signal CLK3. This clock signal CLK3 is delayed with the predetermined time period as compared with the clock signal CLK2, and is delayed with two-fold predetermined time period as compared with the clock signal CLK1.

Subsequently, the clock signal CLK3 produced in the delay gate 1_2 is input into the delay gate 1_3 while being output from the output terminal of the delay gate 1_2 as the clock signal CLK3 of two differential clock pairs. The clock signal CLK3 input into the delay gate 1_3 is further delayed with the predetermined time period as a clock signal CLK4. The clock signal CLK4 is delayed with predetermined time period as compared with the clock signal CLK3, is delayed with two-fold predetermined time period as compared with the clock signal CLK2, and is delayed with three-fold predetermined time period as compared with the clock signal CLK1.

From then on, each clock signal CLK4, CLK5, . . . , CLKN-1 is delayed sequentially in each of the delay gates 1_4 to 1_N-1 at a subsequent stage. Accordingly, clock signals CLK5, CLK6, . . . , CLKN delayed with four-fold, five-fold, . . . , (N-1)-fold predetermined time period as compared with the clock signal CLK1 are output from each output terminal.

(Determining Method of Delay Time)

Next, a determining method of delay time will be explained. When outputting N clock signals CLK1-CLKN, the delay time period per one delay gate is preferable to be determined as ½N cycle period of the input clock signal CLK-I. That is, the delay time period of the clock signal CLK1 of the first stage is set to 0, and each of the clock signals CLK2-CLKN of the second stage or later is delayed with each other by ½N cycle period of the input clock signal CLK-I. Hereinafter, the aforementioned point will be explained in detail referring to FIG. 5.

Figure 5A:
FIG. 5A is an explanatory diagram of delay time per one delay gate according to the embodiment of the present invention, and a diagram showing the case where one clock signal is output.

FIG. 5A shows the case where one clock signal is output. In this case, since not to delay the clock signal, explanation is omitted.

Figure 5B:
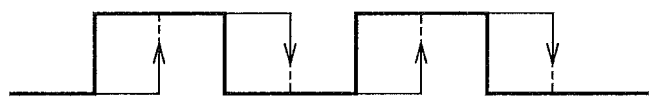
FIG. 5B is an explanatory diagram of delay time per one delay gate according to the embodiment of the present invention, and a diagram showing the case where two clock signals are output.

FIG. 5B shows the case where two clock signals are output. As shown in FIG. 5B, when outputting two clock signals, the clock signal of the second stage is delayed with 1/(2×2) cycle period (i.e., ¼ cycle period) compared with the clock signal of the first stage. Accordingly, either of the clock signals rises or falls in the timing after ¼ cycle period, 2/4 cycle period, ¾ cycle period, . . . on the basis of the time point where the clock signal of the first stage rises.

Figure 5C:
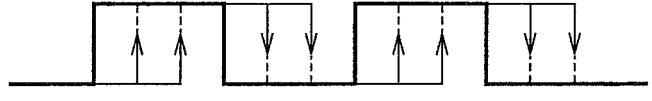
FIG. 5C is an explanatory diagram of delay time per one delay gate according to the embodiment of the present invention, and a diagram showing the case where three clock signals are output.

FIG. 5C shows the case where three clock signals are output. As shown in FIG. 5C, when outputting three clock signals, the clock signal of the second stage is delayed with 1/(2×3) cycle period (i.e., ⅙ cycle period) compared with the clock signal of the first stage. Similarly, the clock signal of the third stage is delayed with ⅙ cycle period compared with the clock signal of the second stage. Accordingly, either of the clock signals rises or falls in the timing after ⅙ cycle period, 2/6 cycle period, 3/6 cycle period, . . . on the basis of the time point where the clock signal of the first stage rises.

Figure 5D:
FIG. 5D is an explanatory diagram of delay time per one delay gate according to the embodiment of the present invention, and a diagram showing the case where four clock signals are output.

FIG. 5D shows the case where four clock signals are output. As shown in FIG. 5D, when outputting four clock signals, the clock signal of the second stage is delayed with 1/(2×4) cycle period (i.e., ⅛ cycle period) compared with the clock signal of the first stage. Similarly, the clock signal of the third stage is delayed with ⅛ cycle period compared with the clock signal of the second stage. Furthermore, the clock signal of the fourth stage is delayed with ⅛ cycle period compared with the clock signal of the third stage. Accordingly, either of the clock signals rises or falls in the timing after ⅛ cycle period, 2/8 cycle period, 3/8, . . . cycle period on the basis of the time point where the clock signal of the first stage rises.

Thus, the clock signals are delayed with each other by ½N cycle period, and thereby the timing of rising and falling of each clock signal can be dispersed equally. Therefore, load applied to a power supply is reduced, and thereby output waveform distortion of the clock signals can be improved.

(Result of Simulation)

Figure 6:
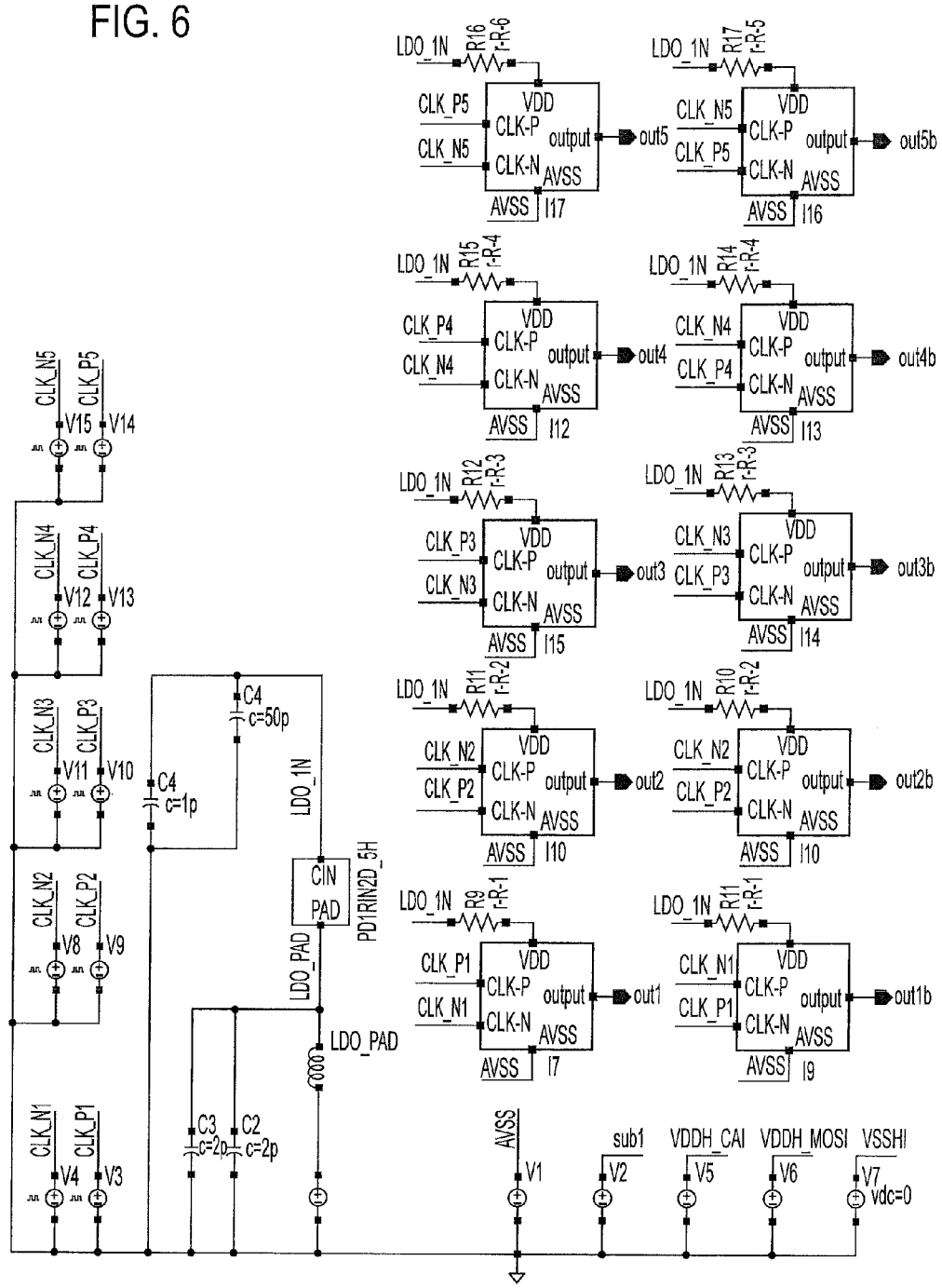
FIG. 6 is a diagram showing a simulation circuit according to the embodiment of the present invention.
Figure 7:
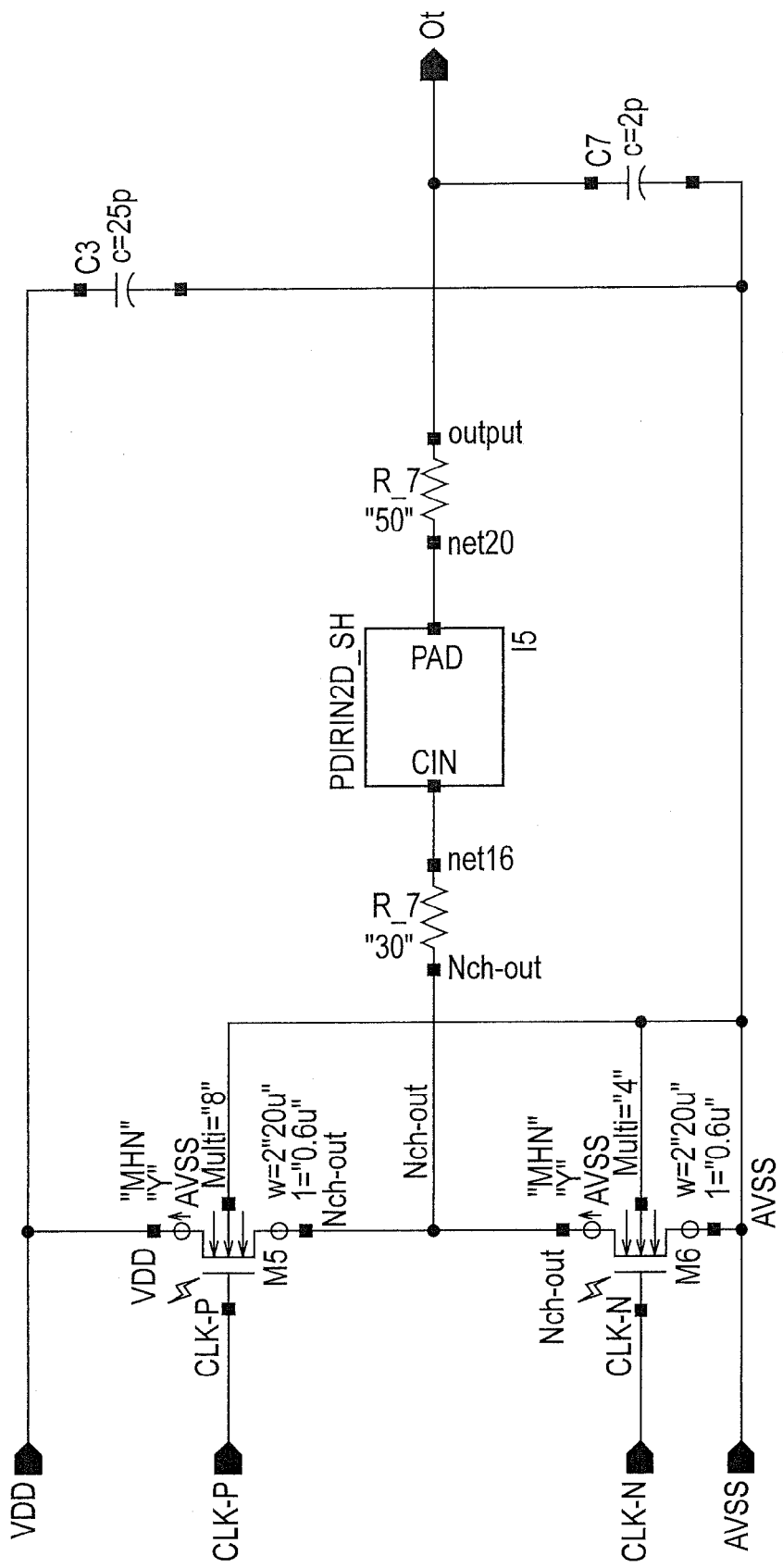
FIG. 7 is a diagram showing the simulation circuit according to the embodiment of the present invention.

Next, a result of a simulation will be explained. Here, since to investigate a delay time period which reduces the load applied to the power supply extremely, the simulation was performed using circuits shown in FIG. 6 and FIG. 7. That is, FIG. 6 shows the case where the five normal clock signals out1-out5 and five inverted clock signals out1b-out5b each having the same frequency (e.g., 100 MHz) are output, and all IO power supplies are supplied from an external power supply. As the delay unit 1, as shown in left-hand of FIG. 6, ideal power supplies disposed vertically to five stages are used. The circuit shown in FIG. 7 is corresponding to each operational amplifier 2_1, 2_2, . . . , 2_N, and C3 shown in the upper right of FIG. 7 is corresponding to each bypass capacitor 3_1, 3_2, . . . , 3_N.

FIG. 8 shows the case where the delay time period per one delay gate is set as 0 psec. FIG. 8A shows power supply potential, FIG. 8B shows the five normal clock signals out1-out5, and FIG. 8C shows five inverted clock signals out1b-out5b. As shown in FIG. 8B and FIG. 8C, when the delay time period is 0 psec, the timing of rising and falling of each clock signal is aligned. Therefore, as shown in FIG. 8A, it proves that the power supply potential is varied largely.

Figures 9A, 9B, 9C:
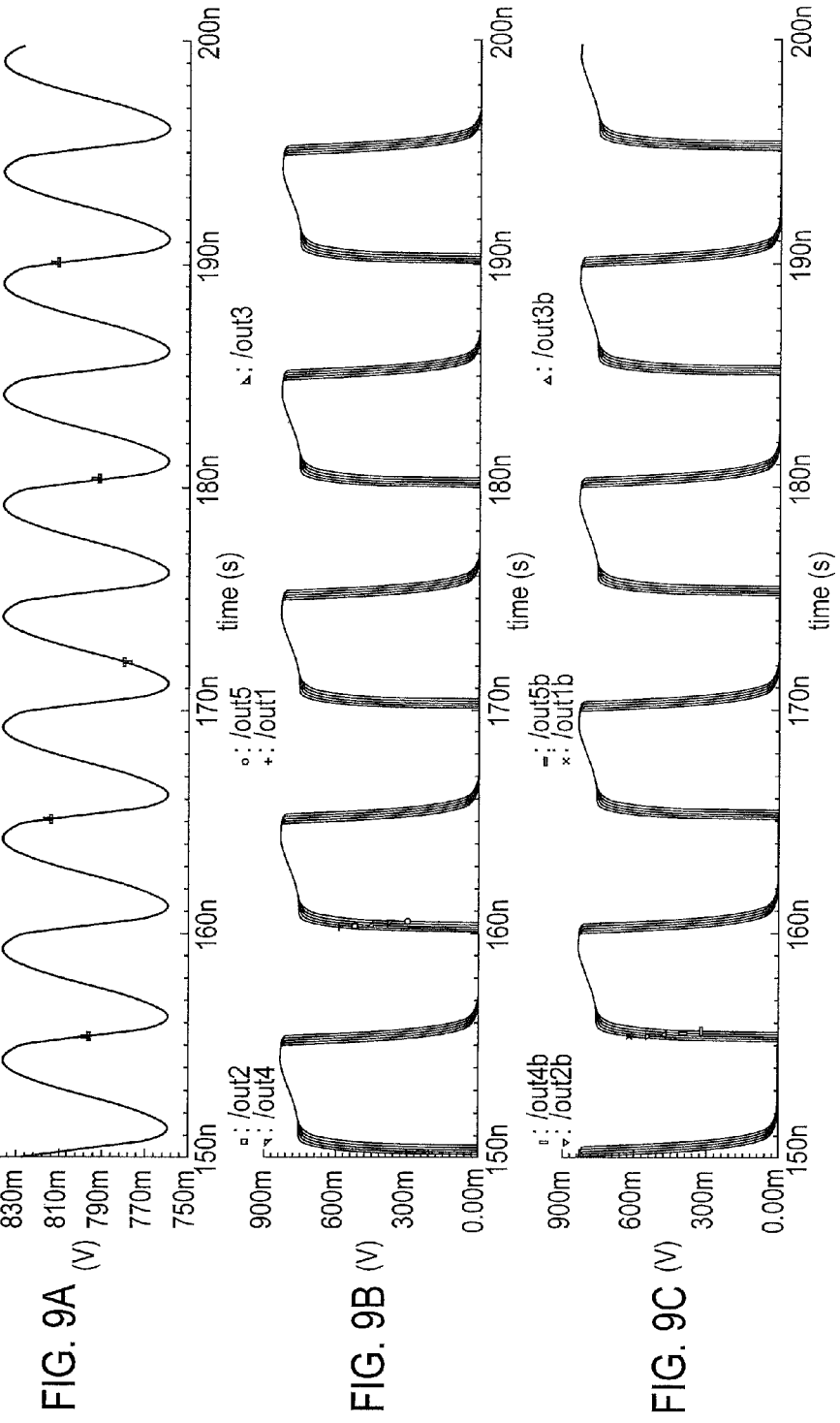
FIG. 9A is a diagram showing the case where the delay time period is 100 psec according to the embodiment of the present invention, and a diagram showing power supply potential.
FIG. 9B is a diagram showing the case where the delay time period is 100 psec according to the embodiment of the present invention, and a diagram showing five normal clock signals.
FIG. 9C is a diagram showing the case where the delay time period is 100 psec according to the embodiment of the present invention, and a diagram showing five inverted clock signals.
Figures 11A, 11B, 11C:
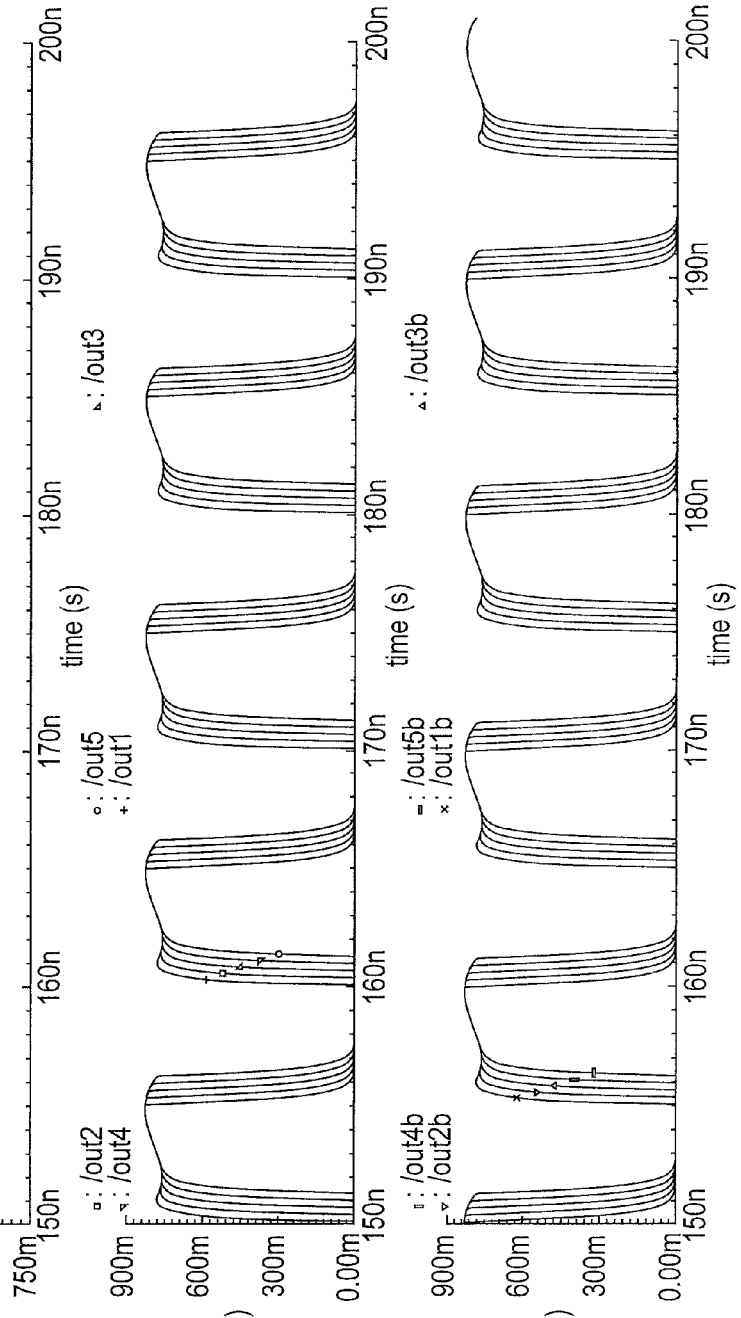
FIG. 11A is a diagram showing the case where the delay time period is 300 psec according to the embodiment of the present invention, and a diagram showing power supply potential.
FIG. 11B is a diagram showing the case where the delay time period is 300 psec according to the embodiment of the present invention, and a diagram showing five normal clock signals.
FIG. 11C is a diagram showing the case where the delay time period is 300 psec according to the embodiment of the present invention, and a diagram showing five inverted clock signals.
Figures 13A, 13B, 13C:
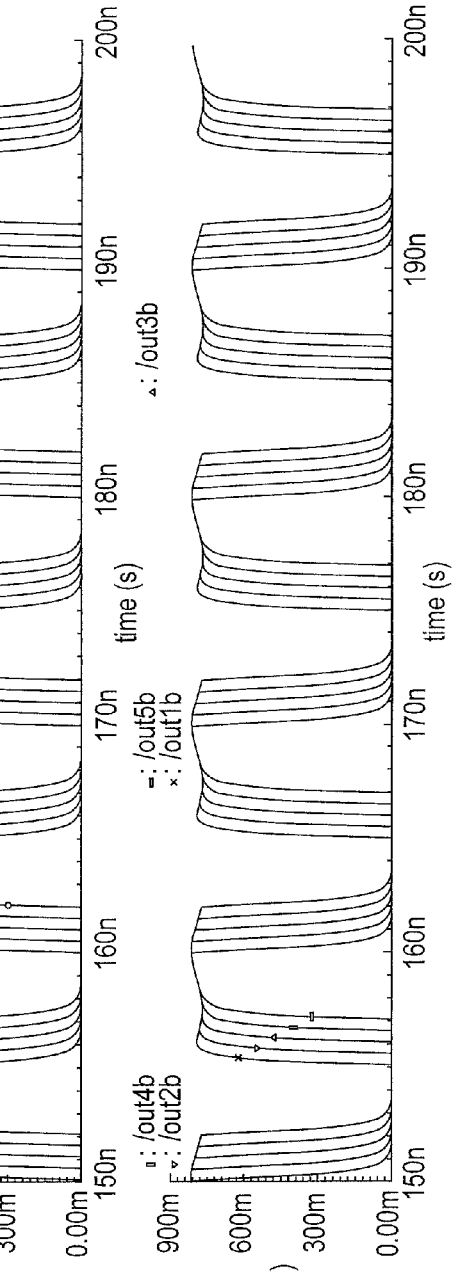
FIG. 13A is a diagram showing the case where the delay time period is 500 psec according to the embodiment of the present invention, and a diagram showing power supply potential.
FIG. 13B is a diagram showing the case where the delay time period is 500 psec according to the embodiment of the present invention, and a diagram showing five normal clock signals.
FIG. 13C is a diagram showing the case where the delay time period is 500 psec according to the embodiment of the present invention, and a diagram showing five inverted clock signals.
Figure 16A:
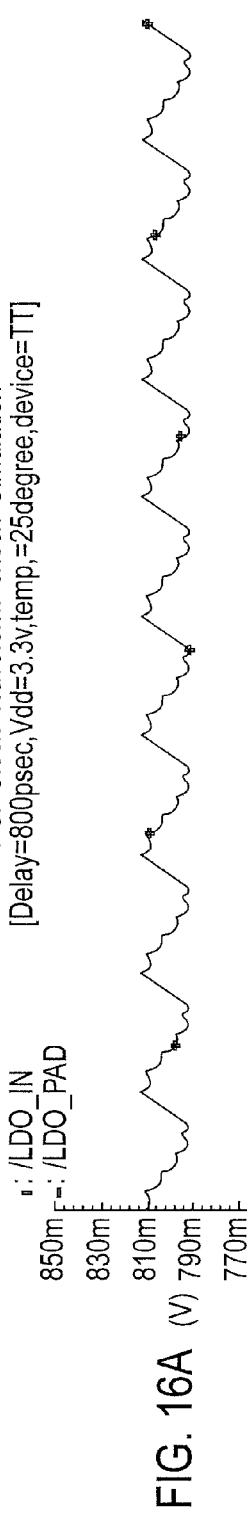
FIG. 16A is a diagram showing the case where the delay time period is 800 psec according to the embodiment of the present invention, and a diagram showing power supply potential.
Figure 16B:
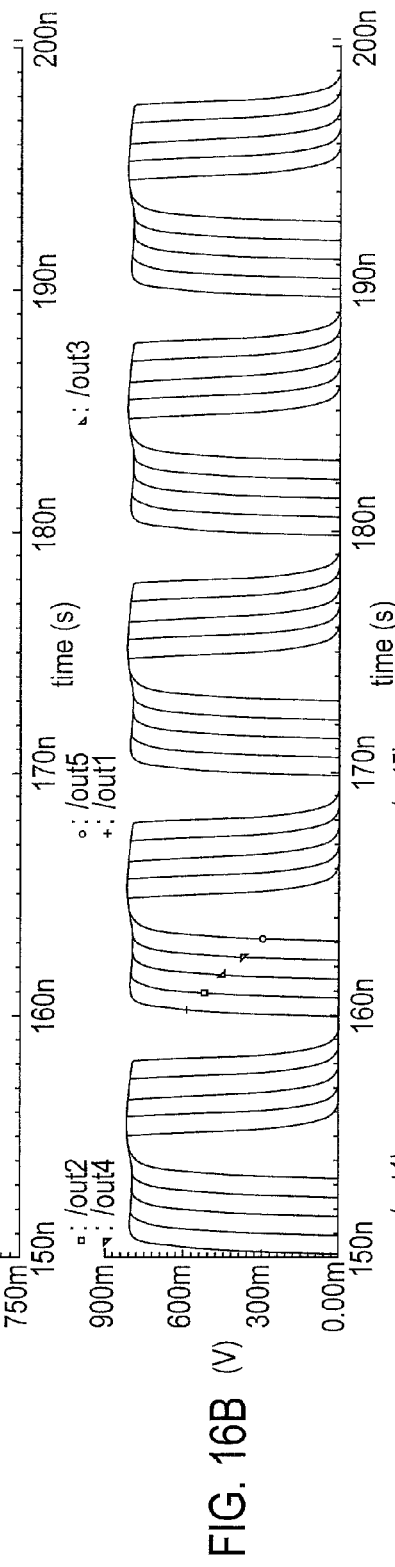
FIG. 16B is a diagram showing the case where the delay time period is 800 psec according to the embodiment of the present invention, and a diagram showing five normal clock signals.
Figure 16C:
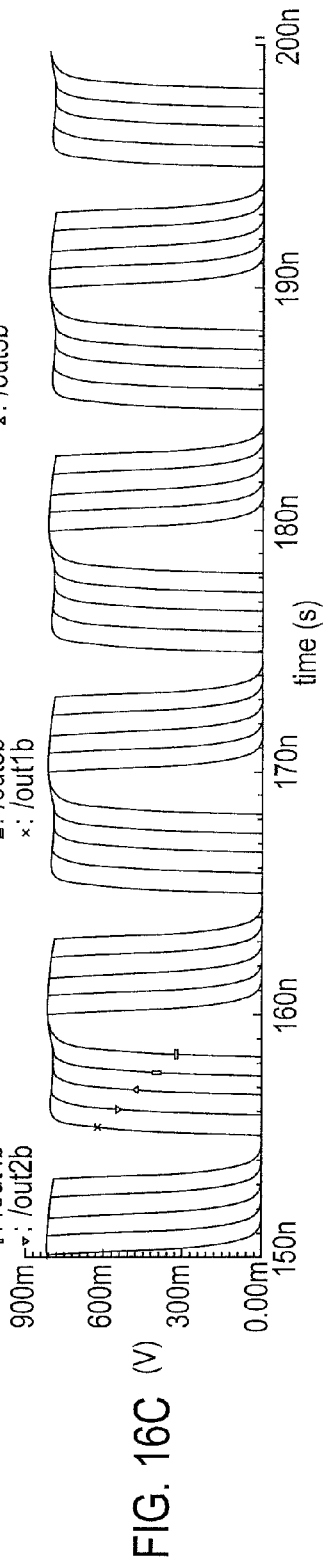
FIG. 16C is a diagram showing the case where the delay time period is 800 psec according to the embodiment of the present invention, and a diagram showing five inverted clock signals.

FIG. 9 shows the case where the delay time period is 100 psec. As shown in FIG. 9, when the delay time period is set to 100 psec, timing of rising and falling of each clock signal is delayed with each other by 100 psec. Accordingly, widths of the variations of the power supply potential are decreased even in small amount. Hereinafter, the variations of the power supply potential were investigated, setting the delay time periods to be shifted to each other by 100 psec. Each result of measurement is shown in FIGS. 9-18.

Figure 18A:
FIG. 18A is a diagram showing the case where the delay time period is 1000 psec according to the embodiment of the present invention, and a diagram showing power supply potential.
Figure 18B:
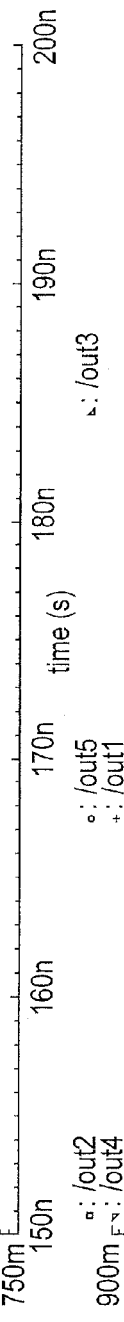
FIG. 18B is a diagram showing the case where the delay time period is 1000 psec according to the embodiment of the present invention, and a diagram showing five normal clock signals.
Figure 18C:
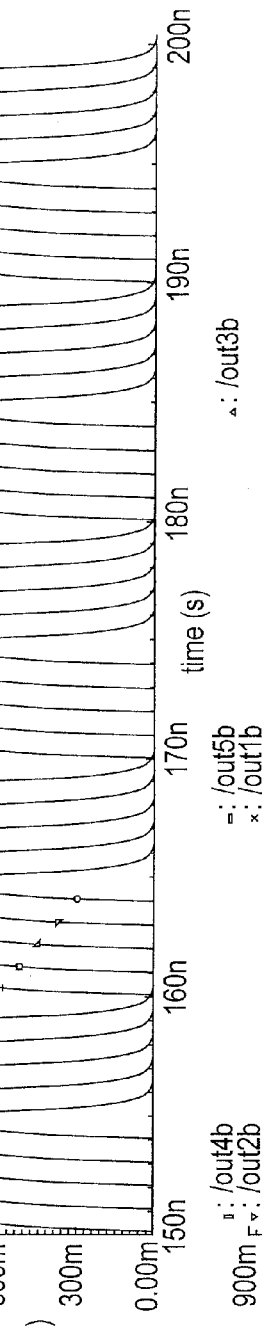
FIG. 18C is a diagram showing the case where the delay time period is 1000 psec according to the embodiment of the present invention, and a diagram showing five inverted clock signals.

The variations of the power supply potential are reduced as the delay time period is set to longer time periods, as shown in FIGS. 9-18. Then, as shown in FIG. 18, when the delay time period is 1000 psec, the power supply potential is almost fixed near 800 mV. Although not illustrated, when the delay time period is set to 1100 psec by adding further 100 psec, the variations of the power supply potential became larger, compared with the case where the delay time period is set to 1000 psec. That is, in the circuits as shown in FIG. 6 and FIG. 7, if the delay time period per one delay gate is set as 1000 psec, the load applied to the power supply can be reduced extremely.

In this case, although N-1 delay gates each whose delay time period is the same are connected in a shape of a cascade, the present invention is not limited to the aforementioned structure. That is, the delay gates each whose delay time period differs from each other may be disposed in parallel. Alternatively, both of the structures maybe combined. Other delay elements can also be used instead of the delay gate.

Moreover, in this case, although the predetermined delay time period is provided to the N clock signals, it is not necessary to provide the delay time period to the clock signal CLK1 of the first stage, as described above. In this case, the predetermined delay time period can be considered to be 0. Of course, the similar delay time period as that of the clock signals CLK2-CLKN of the second stage or later can also be provided to the clock signal CLK1 of the first stage.

Moreover, although the delay time period per one delay gate is set as ½N cycle period of the input clock signal CLK-I, it is not necessary to satisfy the aforementioned conditions. That is, the delay time period can be modified suitably as required.

(Alternative Determining Method of Delay Time)

Figure 19A:
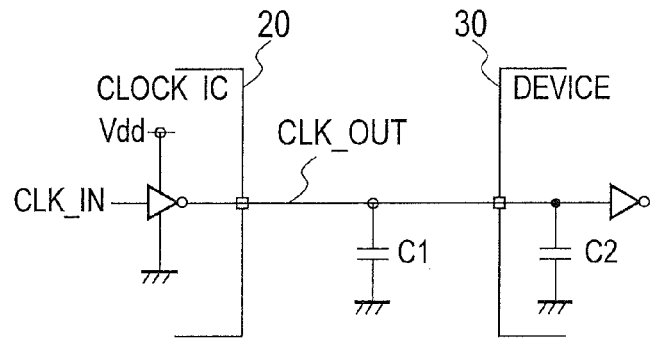
FIG. 19A is a diagram showing an alternative determining method of delay time according to the embodiment of the present invention, and is a schematic circuit diagram.
Figure 19B:
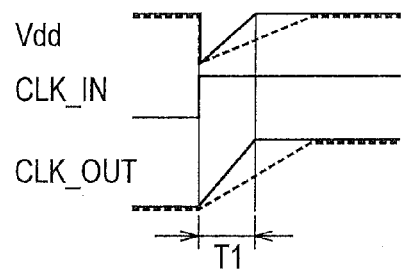
FIG. 19B is a diagram showing the alternative determining method of delay time according to the embodiment of the present invention, and an explanatory diagram of time T1 where the clock signal is turned to a high level from a low level.
Figure 19C:
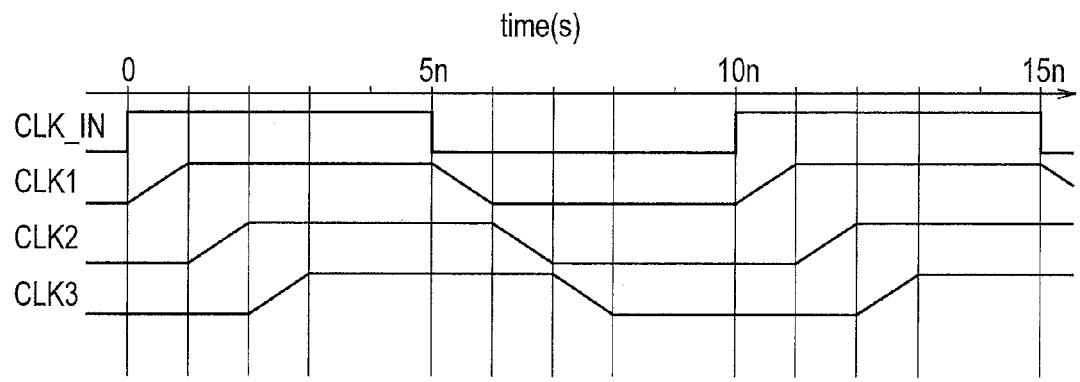
FIG. 19C is a diagram showing the alternative determining method of delay time according to embodiment of the present invention, and a diagram showing the case where three 100-MHz clock signals are outputted.

FIG. 19 is a diagram showing an alternative determining method of the delay time. Here, FIG. 19A shows an aspect that a clock IC (the semiconductor device) 20 outputs an input clock signal CLK-IN as a clock signal CLK_OUT, and the clock signal CLK_OUT is input into a device 30 which should be driven. In this case, a parasitic capacitor C1 (e.g. a printed circuit board (PCB) pattern) is disposed between the clock IC 20 and the device 30, and there is also a gate capacitance C2 in the device 30. Therefore, as shown in T1 of FIG. 19B, the load applied to the power supply becomes heavy due to electric charging from Vdd to the parasitic capacitor C1 etc. Such a tendency is remarkable as the parasitic capacitor C1 etc. becomes large, as a dotted line shown in FIG. 19B. Accordingly, it should just provide a delay time period equivalent to the time period T1 where the clock signal CLK_OUT is turned from a low level to a high level (or from a high level to a low level). For example, FIG. 19C shows the case of outputting three clock signals CLK_1-3 of 100 MHz (i.e., 10 nsec periods). In this case, since time period to which the clock signals CLK_1-3 are turned from the low level to the high level is 1 nsec, it should just delay the clock signals CLK_1-3 with each other by 1 nsec. Thus, it is also possible to determine the delay time period in consideration of effect under the rise time and the fall time of the clock signals.

(Alternative Disposition Example of Bypass Capacitor)

Figure 20:
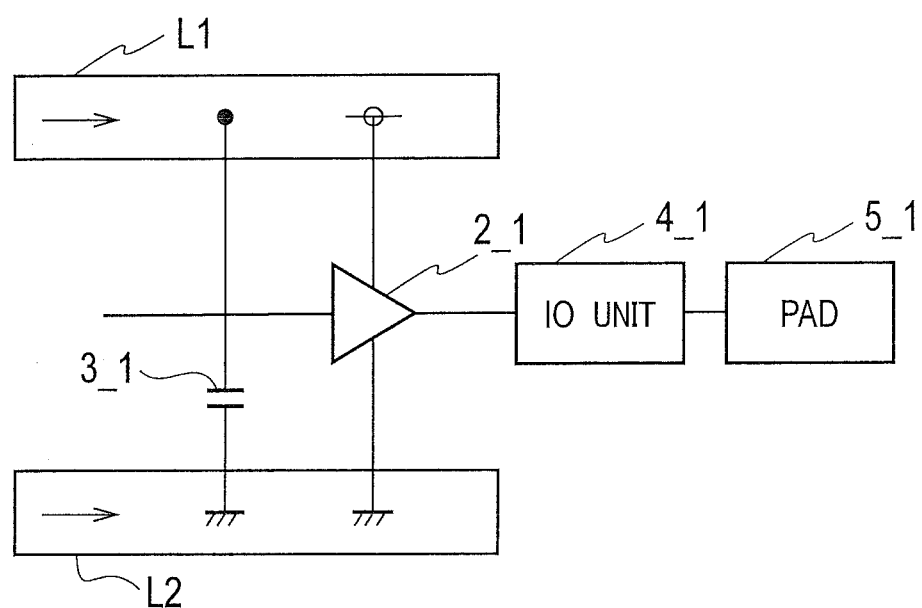
FIG. 20 is a diagram showing an alternative disposition example of the bypass capacitor according to the embodiment of the present invention.
Figure 21:
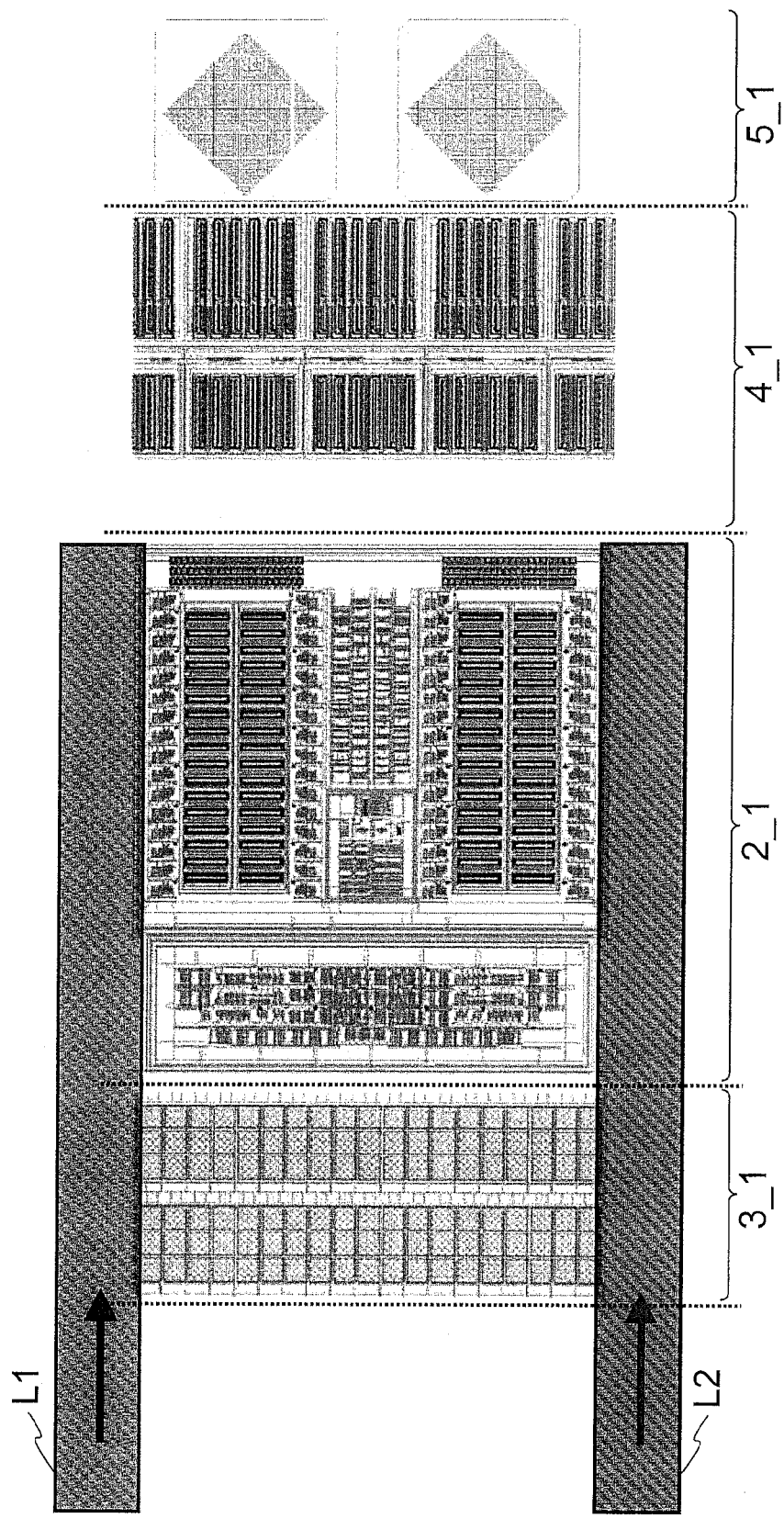
FIG. 21 is a diagram showing a detailed disposition example of the bypass capacitor according to the embodiment of the present invention.

FIG. 20 is a diagram showing an alternative disposition example of the bypass capacitor in the embodiment of the present invention. A point that the bypass capacitors 3_1, 3_2, ..., 3_N are closely disposed for each output IO is as having already explained using FIG. 4. The structure including the inverter is shown in FIG. 4, but a structure including an operational amplifier 2_1 is shown in FIG. 20. A first edge of the operational amplifier 2_1 is connected to a power supply line L1, and a second edge of the operational amplifier 2_1 is connected to a ground line L2. An IO section 4_1 is disposed at the subsequent stage of the operational amplifier 2_1, and other devices are further connected via a PAD 5_1. A first edge of the bypass capacitor 3_1 is connected to the power supply line L1, and a second edge of the bypass capacitor 3_1 is connected to the ground line L2. Here, although the explanation is given with focus of attention on the bypass capacitor 3_1, of course, other bypass capacitors 3_2, ..., 3_N are the same as the bypass capacitor 3_1. A detailed disposition example of such a bypass capacitor is shown in FIG. 21. Of course, the reference numerals in FIG. 21 correspond to the reference numerals in FIG. 20.

As already explained, the bypass capacitors 31, 3_2, ..., 3_N are closely disposed for each output IO, in this embodiment. The phrase "being closely disposed" is corresponding that the value of the resistance between the output IO and the bypass capacitor is reduced. For example, the value of the resistance between the output IO and the bypass capacitor can be reduced by making the wiring short or thick.

(Application Example of Semiconductor Device)

Figure 22:
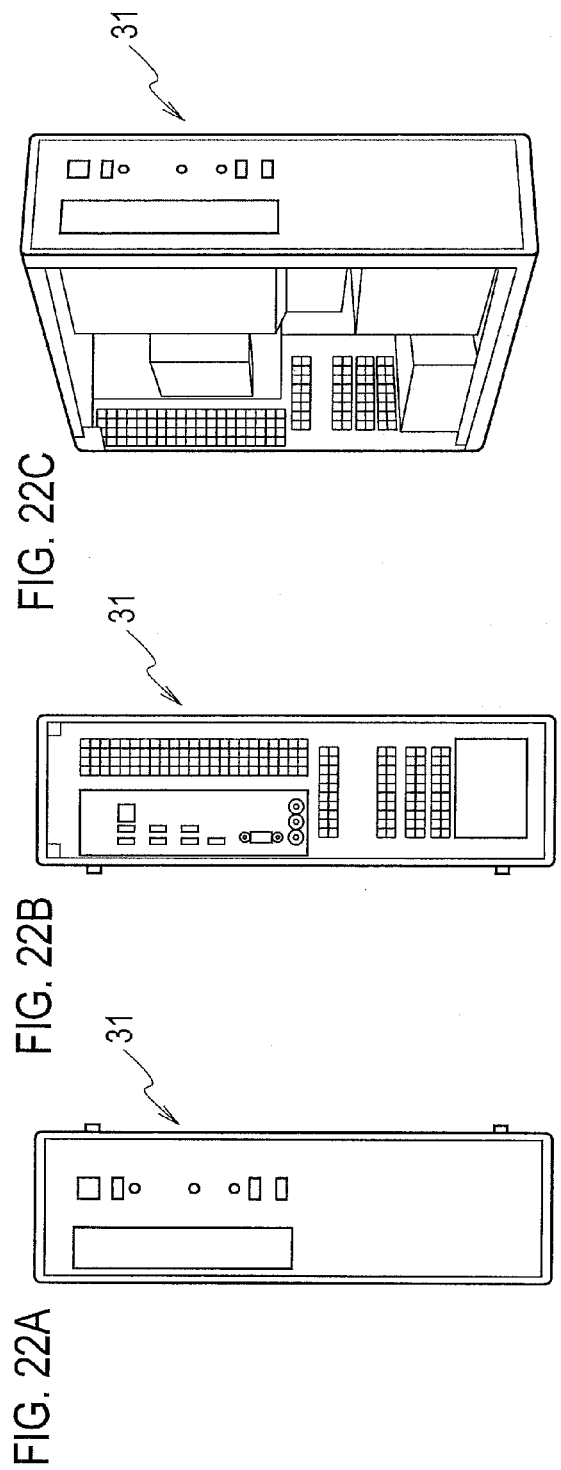
FIG. 22A is a diagram showing an application example of the semiconductor device according to the embodiment of the present invention, and is a schematic front view diagram of a main unit of personal computer (PC).
FIG. 22B is a diagram showing an application example of the semiconductor device according to the embodiment of the present invention, and is a schematic rear view diagram of the main unit of PC.
FIG. 22C is a diagram showing an application example of the semiconductor device according to the embodiment of the present invention, and a schematic perspective diagram in the condition where a computer chassis of a side of the main unit of PC is removed.
FIG. 22D is a diagram showing an application example of the semiconductor device according to the embodiment of the present invention, and a schematic top view diagram of a mother board mounted in the main unit of PC.

FIG. 22 is a diagram showing an application example of the semiconductor device according to the embodiment of the present invention. More specifically, FIG. 22A shows a schematic front view diagram of a main unit of a personal computer (PC) 31. FIG. 22B is a schematic rear view diagram of the main unit of PC 31. FIG. 22C is a schematic perspective diagram in the condition of being removed a computer chassis of a side surface of the main unit of PC 31. FIG. 22D is a schematic top view diagram of a mother board 32 mounted in the main unit of PC 31.

Various kinds of devices (e.g., CPU, a clock generator, etc.) are mounted on the mother board 32. The semiconductor device according to the embodiment is applicable to the clock generator mounted on the mother board 32. That is, CPU 41 is connected to an IO chip 42, an SD card 43, a field programmable gate array (FPGA) 44, and a PCI slot 45 and 46, etc. using PCI Express, as shown by dotted-line arrows in FIG. 23. A network card, a SCSI card, a sound card, etc. are mounted on the PCI slots 45 and 46. In such a case, it is necessary to input a clock signal defined in the PCI Express into various kinds of devices (e.g., the CPU 41, the IO chip 42, etc.). That is, the clock generator 47 inputs the clock signal CLK_OUT, which is synchronized, into the various kinds of devices (e.g., the CPU 41, the IO chip 42, etc.), as shown by full-line arrows in FIG. 23. In accordance with the semiconductor device according to the embodiment applied to such a clock generator 47, it is possible to input the clock signal CLK_OUT, in which output waveform distortion is improved, into the various kinds of devices (e.g., the CPU 41, the IO chip 42, etc.).

Figure 23:
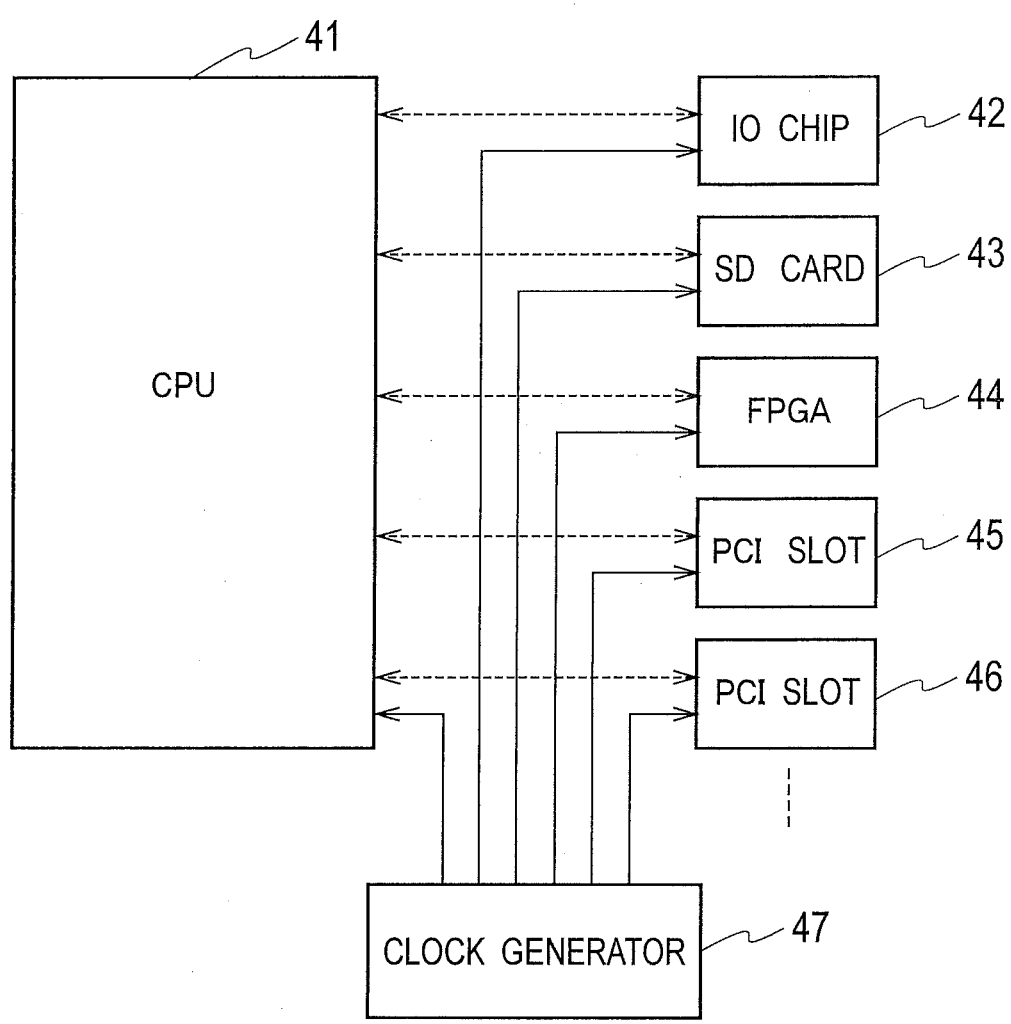
FIG. 23 is a schematic block diagram of the mother board according to the embodiment of the present invention.
Figure 24D:
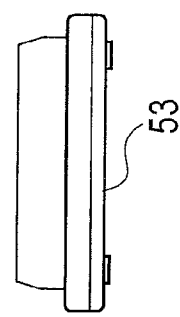
FIG. 24D is a diagram showing the alternative application example of the semiconductor device according to the embodiment of the present invention, and is a schematic rear view diagram of the stand.
Figure 24C:
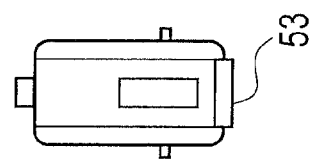
FIG. 24C is a diagram showing the alternative application example of the semiconductor device according to the embodiment of the present invention, and is a schematic side view of the stand.
Figure 24B:
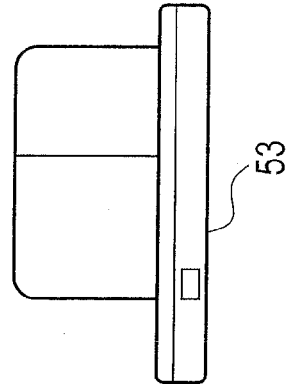
FIG. 24B is a diagram showing the alternative application example of the semiconductor device according to the embodiment of the present invention, and a schematic front view diagram of a stand.
Figure 24A:
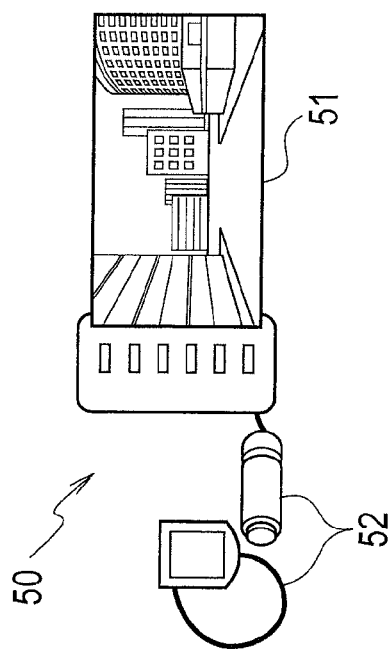
FIG. 24A is a diagram showing an alternative application example of the semiconductor device according to the embodiment of the present invention, and a schematic front view diagram of a car-navigation system.

FIG. 24 is a diagram showing an alternative application example of the semiconductor device according to the embodiment of the present invention. More specifically, FIG. 24A shows a schematic front view diagram of a car-navigation system 50. The car-navigation system 50 includes a main unit 51 and required accessories 52. The main unit 51 can be attached on a stand 53. FIG. 24B is a schematic front view diagram of the stand 53, FIG. 24C is a schematic side view of the stand 53, and FIG. 24D is a schematic rear view diagram of the stand 53. The semiconductor device according to the embodiment is applicable also to a clock generator mounted in such a car-navigation system 50. Detailed structure is the same as that of the PC 31 (FIG. 23). The semiconductor device according to the embodiment can be applied to other electronic apparatus (e.g., a medical device, an entertainment device, an embedded system, etc.).

As mentioned above, in accordance with the semiconductor device according to the embodiment of the present invention, the timing of rising and falling of each clock signal is dispersed by providing the predetermined delay time period to the plurality of the clock signals, and thereby the load applied to the power supply in common to the plurality of the clock signals can be reduced. That is, it is possible to improve the output waveform distortion of the clock signals even with simple structure, without providing an individual power supply for each output of the clock signals as conventional.

Specifically, the semiconductor device according to the embodiment of the present invention includes: the delay unit 1 which provides the predetermined delay time period for the plurality of the clock signals, and the output IO which outputs the plurality of the clock signals delayed in the delay unit 1.

Accordingly, it is possible to improve the output waveform distortion of the clock signals even with simple structure.

Moreover, the output IO includes the operational amplifiers 2_1, 2_2, ..., 2_N which output two differential clock pairs in which polarity is reversed. Accordingly, it is possible to output a normal clock signal and an inverted clock signal from each output terminal.

Moreover, the output IO may include an inverter which generates the clock signal as a single ended output (inverter output). That is, it is an available means not only to include the differential output, but to include the inverter output.

Moreover, when the number of the plurality of the clock signals is N, the delay unit 1 delays each clock signal with each other by ½N cycle period of the input clock signal CLK-I. Accordingly, the timing of falling and rising of each clock signals can be dispersed equally.

Furthermore, when the number of the plurality of the clock signals is N, the N-1 delay gates 1_1, 1_2, ..., 1_N-1 each whose delay time period is the same is connected in a shape of a cascade, in the delay unit 1. In such a manner, it is possible to provide the predetermined delay time period to N clock signals even with simple structure.

The delay unit 1 includes the delay gates each whose delay time period differs from each other in parallel, when the number of the plurality of the clock signals is N. Accordingly, it is possible to provide the predetermined delay time period to N clock signals.

Furthermore, the delay unit 1 provides the delay time period equivalent to the time period where the clock signal output from the output IO is turned from a low level to a high level (or from a high level to a low level). Accordingly, it is also possible to determine the delay time period in consideration of effect under the rise time and the fall time of the clock signals.

Moreover, the bypass capacitors 3_1, 3_2, ..., 3_N are closely disposed for each output IO. Accordingly, it is possible to achieve a high speed response.

Moreover, a value of resistance between the output IO and the bypass capacitors 3_1, 3_2, ..., 3_N are reduced. Accordingly, if the bypass capacitors 3_1, 3_2, ..., 3_N are closely disposed for each output IO, the effect can be enhanced.

[Other Embodiments]

While the present invention is described in accordance with the aforementioned embodiment, it should be understood that the description and drawings that configure part of this disclosure are not intended to limit the present invention. This disclosure makes clear a variety of alternative embodiments, working examples, and operational techniques for those skilled in the art.

Note that the present invention is not only achievable as the semiconductor device, but also achievable as a method of improving the output waveform distortion including a step(s) to which a characteristic process of such a semiconductor device is realized. The present invention is also achievable as a computer program for making a computer execute the step(s). It needless to say that such a program can be distributed via recording media (e.g., CD-ROM) and/or transmission media (e.g., Internet).

The present invention covers a variety of embodiments, whether described or not. Therefore, the technical scope of the present invention is appointed only by the invention specific matter related appropriate scope of claims from the above-mentioned explanation.

Such being the case, the present invention covers a variety of embodiments, whether described or not.

INDUSTRIAL APPLICABILITY

The semiconductor device and the method of improving the output waveform distortion according to the present invention are applicable to an electronic apparatus with required outputting a plurality of clock signals of the same frequency. More specifically, the semiconductor device and the method of improving the output waveform distortion according to the present invention is applicable to a personal computer, a car-navigation system, a medical device, an entertainment device, an embedded system, or the like.

What is claimed is:

1. A semiconductor device comprising:
   an input unit configured to input an input clock signal of predetermined frequency;
   a delay unit configured to generate a plurality of clock signals of the same frequency by providing predetermined delay time period to the input clock signal to be delayed in order to reduce load applied to a power supply in common with the plurality of the clock signals; and
   an output IO configured to output the plurality of the clock signals delayed and generated by the delay unit,
   wherein a bypass capacitor is closely disposed for the output IO.

2. The semiconductor device according to claim 1, wherein the output IO comprises an operational amplifier configured to output two differential clock pairs in which polarity is reversed.

3. The semiconductor device according to claim 1, wherein the output IO comprises an inverter configured to generate the clock signal as a single ended output.

4. The semiconductor device according to claim 1, wherein the delay unit delays each clock signal with each other by ½N cycle period of the input clock signal, when the number of the plurality of the clock signals is N.

5. The semiconductor device according to claim 1, wherein the delay unit includes a structure in which N-1 delay elements each whose delay time period is the same are connected in a shape of a cascade when the number of the plurality of the clock signals is N, thereby providing the predetermined delay time period to N clock signals.

6. The semiconductor device according to claim 1, wherein the delay unit includes a structure in which delay gates each whose delay time period differs from each other are disposed in parallel when the number of the plurality of clock signals is N, thereby providing the predetermined delay time period to N clock signals.

7. The semiconductor device according to claim 1, wherein the delay unit provides a delay time period equivalent to a time period where the clock signal output from the output IO is turned from a low level to a high level or from a high level to a low level.

8. The semiconductor device according to claim 1, wherein a value of resistance between the output IO and the bypass capacitor is reduced.

9. An electronic apparatus comprising a semiconductor device, the semiconductor device comprising:
   an input unit configured to input an input clock signal of predetermined frequency;
   a delay unit configured to generate a plurality of clock signals of the same frequency by providing predetermined delay time period to the input clock signal to be delayed in order to reduce load applied to a power supply in common with the plurality of the clock signals; and
   an output IO configured to output the plurality of the clock signals delayed and generated by the delay unit,
   wherein a bypass capacitor is closely disposed for the output IO.

10. The electronic apparatus according to claim 9, wherein the electronic apparatus is a personal computer.

11. The electronic apparatus according to claim 9, wherein the electronic apparatus is a car-navigation system.

* * * * *